(12) United States Patent
Matsushita et al.

(10) Patent No.: US 10,145,886 B2
(45) Date of Patent: Dec. 4, 2018

(54) LEAKAGE CURRENT CALCULATION DEVICE AND LEAKAGE CURRENT CALCULATION METHOD

(71) Applicant: Tanashin Denki Co., Ltd., Tokyo (JP)

(72) Inventors: Kenya Matsushita, Tokyo (JP); Masakatsu Sawada, Tokyo (JP)

(73) Assignee: Tanashin Denki Co., Ltd., Tokyo (JP)

( * ) Notice: Subject to any disclaimer, the term of this patent is extended or adjusted under 35 U.S.C. 154(b) by 0 days.

(21) Appl. No.: 15/514,499

(22) PCT Filed: Sep. 7, 2015

(86) PCT No.: PCT/JP2015/004519
§ 371 (c)(1),
(2) Date: Jul. 10, 2017

(87) PCT Pub. No.: WO2016/047057
PCT Pub. Date: Mar. 31, 2016

(65) Prior Publication Data
US 2017/0307675 A1  Oct. 26, 2017

(30) Foreign Application Priority Data

Sep. 26, 2014 (JP) .................. 2014-196143

(51) Int. Cl.
*G01R 31/02* (2006.01)
*G01R 31/34* (2006.01)

(52) U.S. Cl.
CPC .......... *G01R 31/025* (2013.01); *G01R 31/346* (2013.01)

(58) Field of Classification Search
CPC .................................................. G01R 31/025
(Continued)

(56) References Cited

U.S. PATENT DOCUMENTS

| 2010/0131215 A1* | 5/2010 | Kim ..................... G01R 31/025 702/58 |
| 2012/0025840 A1* | 2/2012 | Kim ..................... G01R 31/025 324/509 |

FOREIGN PATENT DOCUMENTS

| JP | 2000028671 | 1/2000 |
| JP | 2001352663 | 12/2001 |

(Continued)

*Primary Examiner* — John H Le
(74) *Attorney, Agent, or Firm* — Huffman Law Group, PC

(57) ABSTRACT

Provided is a leakage current value calculation device which precisely calculates a leakage current $I_0r$ which is a component caused by a ground insulation resistance value of an electric circuit, in the leakage current $I_0$ flowing through the electric circuit. The leakage current calculation device 10 includes a current measurement means 11 which measures a leakage current flowing through an electric circuit A having a predetermined protective conductor, a voltage measurement means 12 which measures respective phase-to-E phase voltages which are voltages between phases of the power supply unit 1 of the electric circuit A and the E phase when the protective conductor is the E phase, a voltage value calculation means 131 which calculates a predetermined voltage value obtained by extracting a voltage component applied to the ground insulation resistor excluding a potential difference caused by a grounding resistor of the protective conductor, based on the respective phase-to-E phase voltages; and a current value calculation means 141 which extracts a component caused by the ground insulation resistance value, excluding a ground capacitance component, from the leakage current, based on the predetermined voltage value.

5 Claims, 7 Drawing Sheets

(58) Field of Classification Search
USPC ........ 702/58, 60, 64, 65; 324/509, 510, 525, 324/551, 762.03
See application file for complete search history.

(56) References Cited

FOREIGN PATENT DOCUMENTS

| | | |
|---|---|---|
| JP | 2007114190 | 10/2007 |
| JP | 2011153910 | 8/2011 |

* cited by examiner

[FIG. 1]
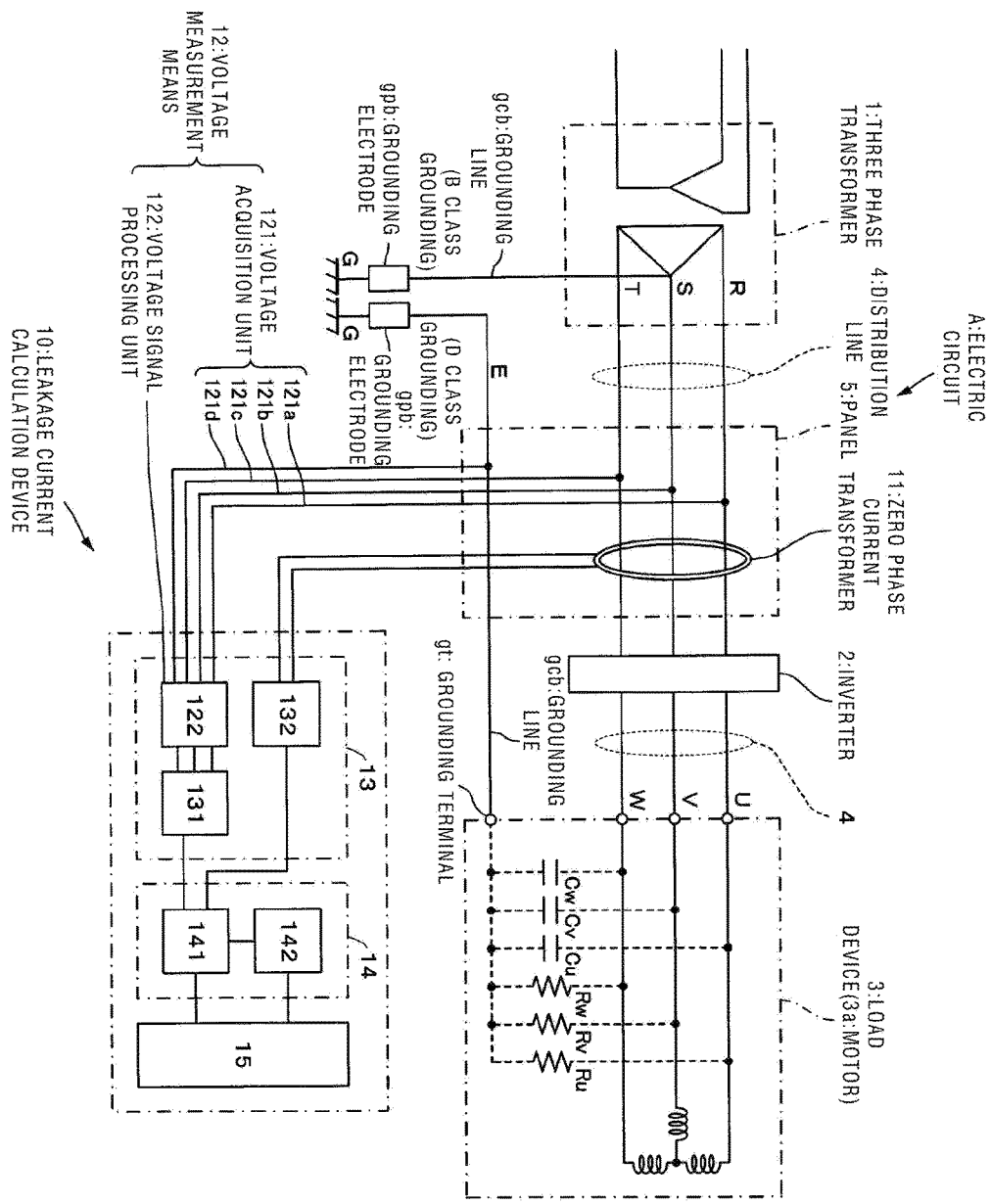

[FIG. 2]
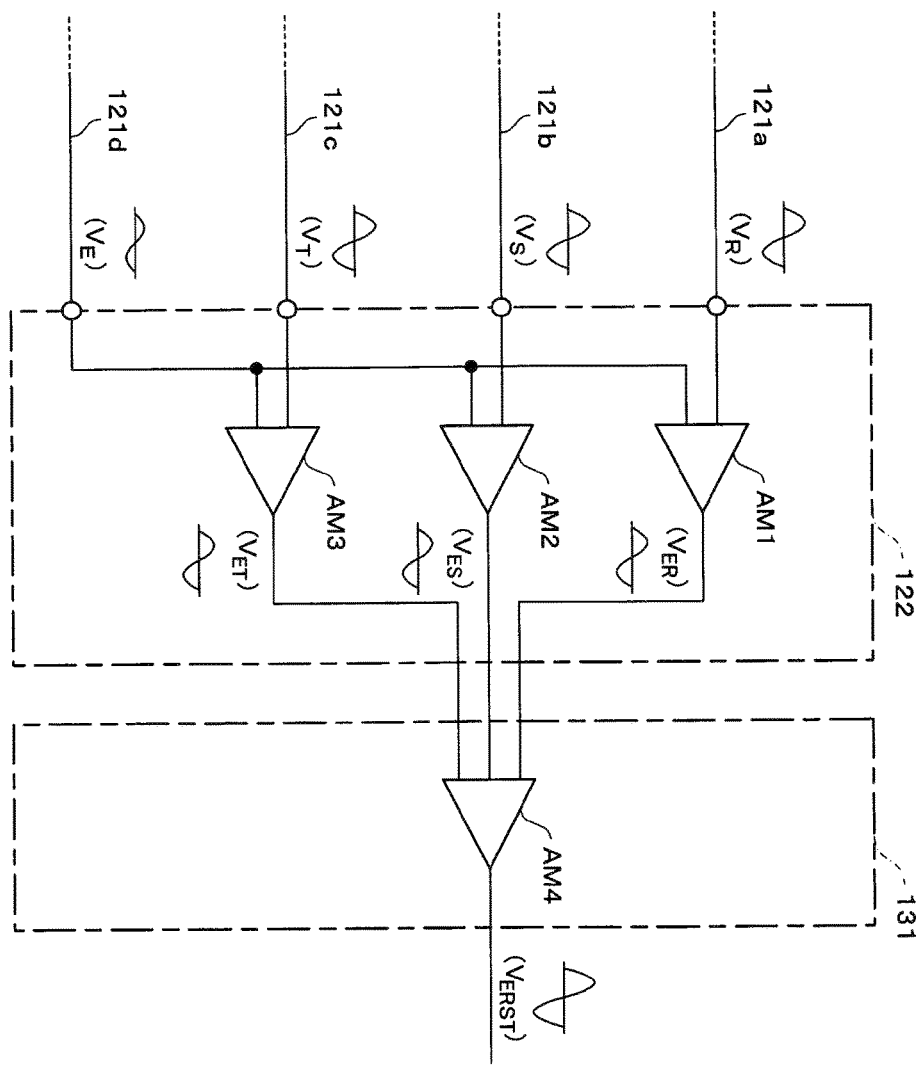

[FIG. 3]
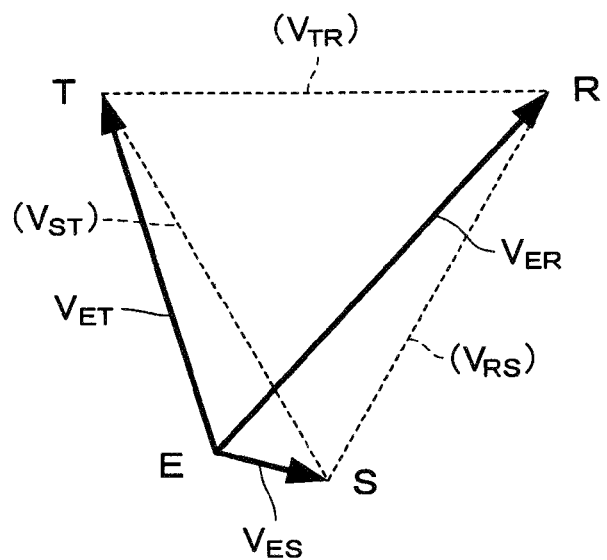
[FIG. 4]
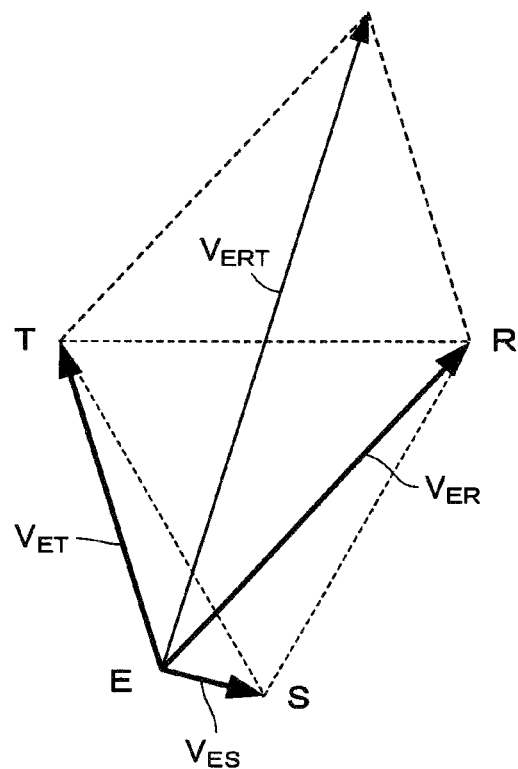

[FIG. 5]
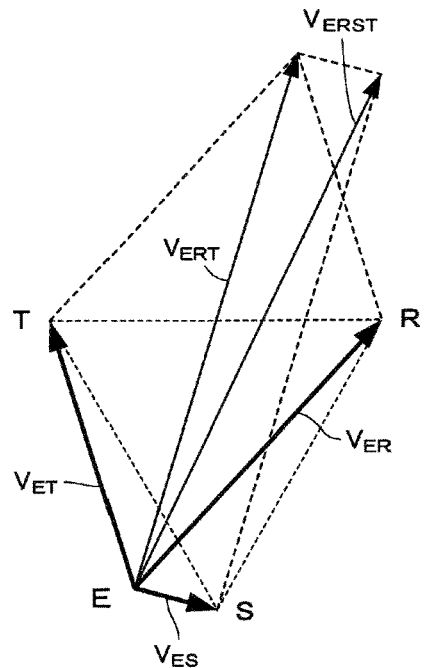
[FIG. 6]
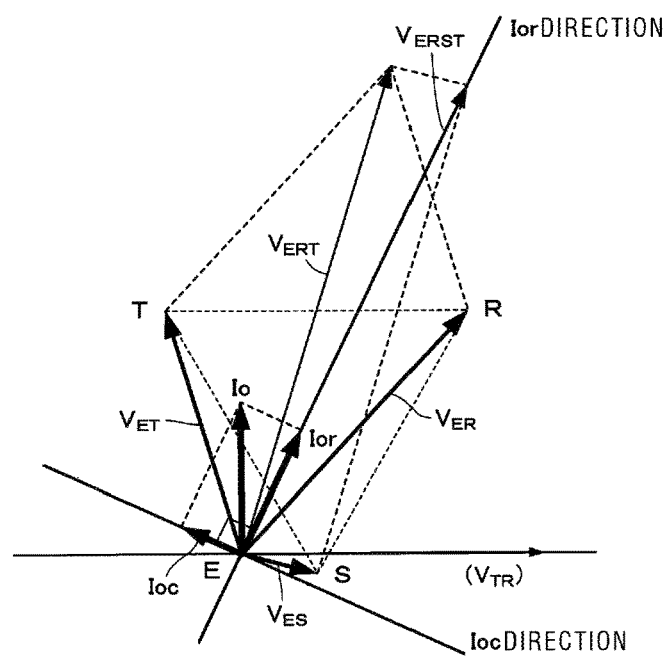

[FIG. 7]
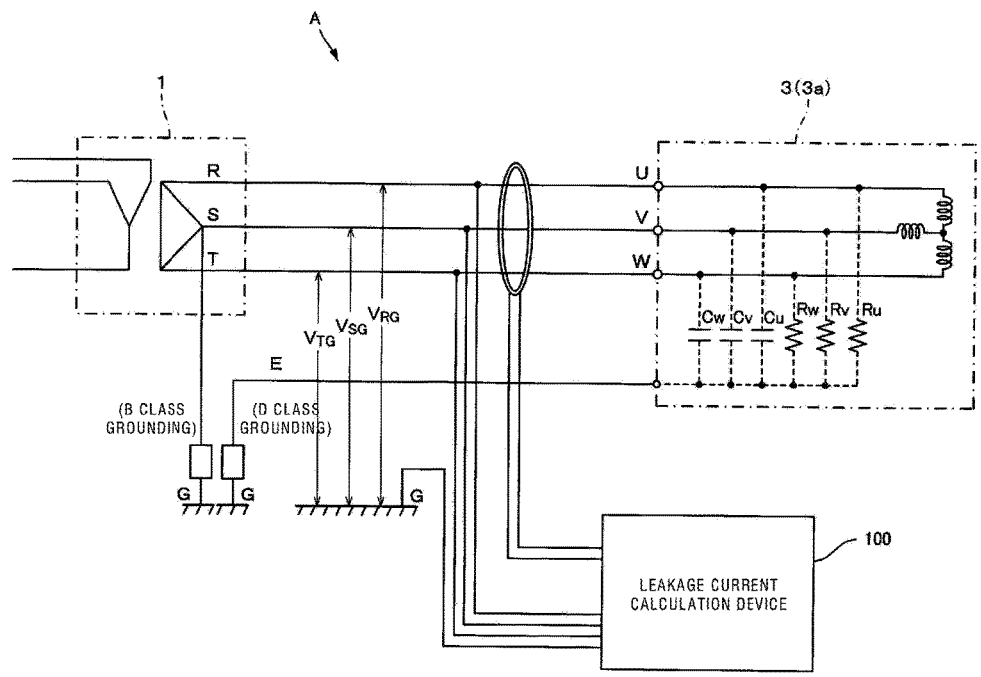
[FIG. 8]
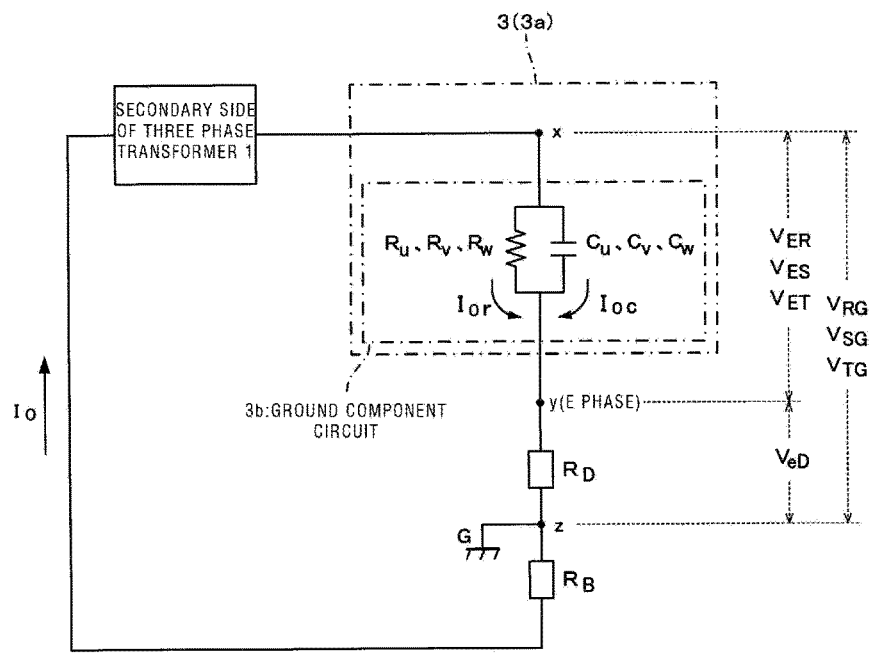

[FIG. 9]
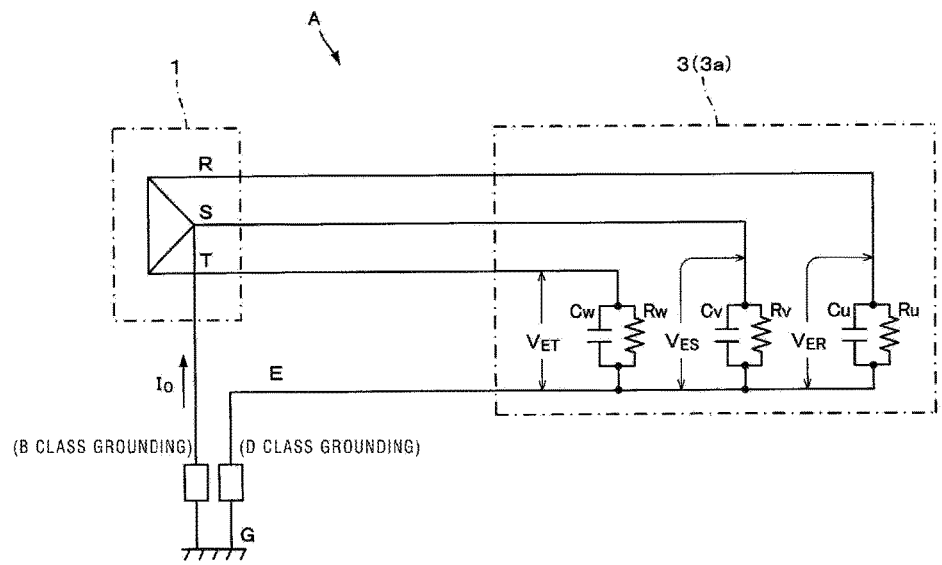
[FIG. 10]
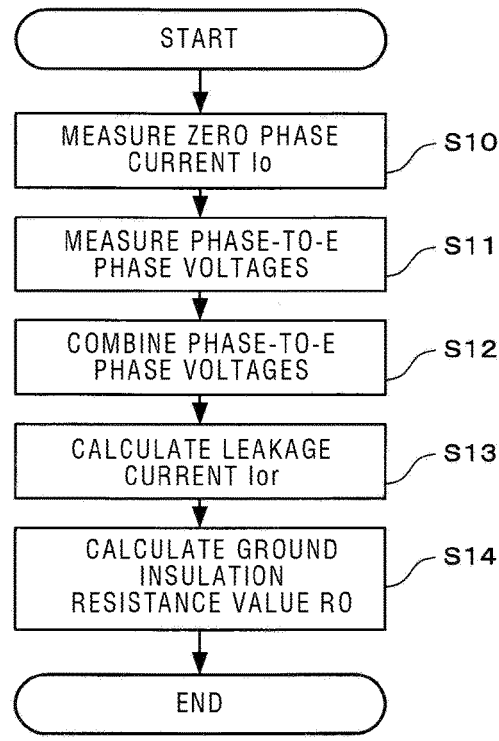

[FIG. 11]
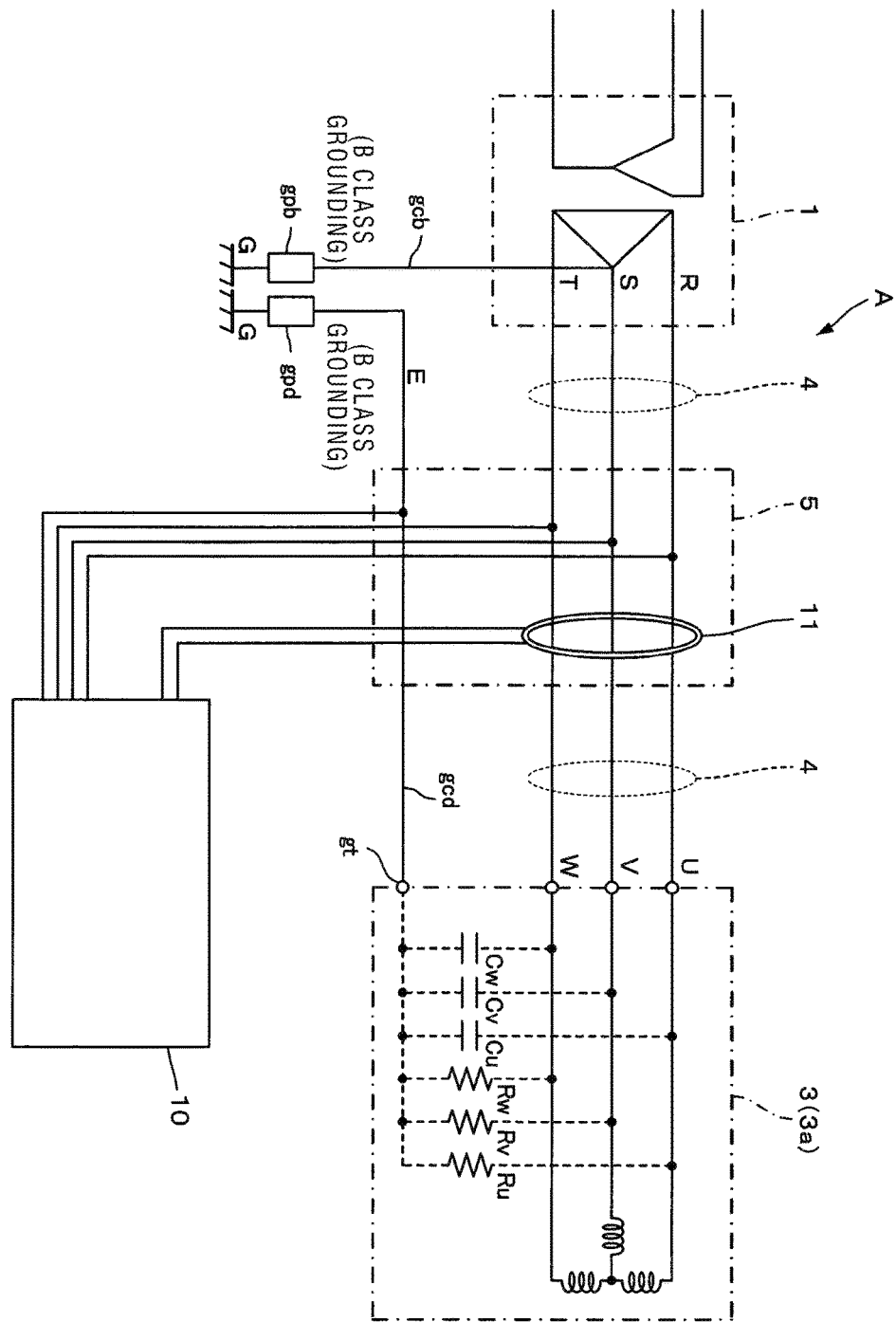

LEAKAGE CURRENT CALCULATION DEVICE AND LEAKAGE CURRENT CALCULATION METHOD

RELATED APPLICATIONS

This application is a national stage of international patent application no. PCT/JP2015/004519, PCT Filing Date of Sep. 26, 2014, which claims priority to JP Patent App. No. 2014-196143, filed Sep. 26, 2014.

TECHNICAL FIELD

The present invention relates to a leakage current calculation device and a leakage current calculation method which extract and measure a component caused by a ground insulation resistance value in an electric circuit, from a leakage current flowing through the electric circuit having a predetermined protective conductor, and particularly to a leakage current calculation device and a leakage current calculation method which extract and measure a component caused by a ground insulation resistance value, excluding a ground capacitance component, from a leakage current flowing through an electric circuit.

BACKGROUND ART

A device which simultaneously measures a leakage current flowing through a predetermined electric circuit as a zero phase current $I_0$ and extracts and measures a leakage current $I_0r$ which is a component caused by a ground insulation resistance value in the electric circuit, from the zero phase current $I_0$ has been known.

For example, a leakage current measurement device (hereinafter, referred to as a "device 1") disclosed in Patent Document 1 measures a R phase and T phase interline voltage $V_{RT}$ (alternatively, a T phase and S phase interline voltage $V_{TS}$ or an S phase and R phase interline voltage $V_{SR}$) on a secondary side of a three phase transformer in which secondary windings are connected in a delta (Δ) type, measures a zero phase current $I_0$ flowing through a distribution line which connects the secondary side of the three phase transformer and a load device, calculates a phase difference of a reference voltage and the zero phase current $I_0$ when the interline voltage $V_{RT}$ (alternatively, $V_{TS}$ or $V_{SR}$) is considered as the reference voltage, and calculates an effective component as the leakage current $I_0r$ by dividing the zero phase current $I_0$ into an effective component which has the same phase as the reference voltage and an ineffective component which has a phase difference of 90 degrees with respect to the reference voltage.

The device 1 is configured such that even when the load device (for example, a motor) is in a driving state and an electric circuit is in a hot-line state, the leakage current $I_0r$ is calculated.

RELATED ART DOCUMENT

Patent Document

Patent Document 1: Japanese Patent Application Laid-Open No. 2011-153910

DISCLOSURE

Technical Problem

Similarly to the above-described device 1, there has been devices which measure the leakage current $I_0r$ since the related art.

Further, in such a measurement device, it is required to more accurately measure the leakage current $I_0r$.

However, in an actual measurement device, due to various factors, an error may be incurred in the measured leakage current $I_0r$.

An object in designing the measurement device is to precisely measure the leakage current $I_0r$ by eliminating factors which cause the error as much as possible.

Further, when an electric circuit is installed in a large size factory having a large site area, if a plurality of facilities, such as a distribution line or a load device, which configures the electric circuit is disposed in a wide range in a building, a leakage current $I_0c$ flowing caused by a ground capacitor in the electric circuit is also increased. Further, there is a problem in that when the leakage current $I_0$ is increased in accordance with increase of the leakage current $I_0c$, since a potential difference caused by a grounding resistor is increased and a phase angle which is required to calculate the leakage current $I_0r$ has an error, it is difficult to precisely calculate the leakage current $I_0r$.

The present invention has been made in an effort to provide a leakage current calculation device and a leakage current calculation method which may precisely calculate a leakage current $I_0r$ which is a component caused by a ground insulation resistance value of an electric circuit, in the leakage current $I_0$ flowing through the electric circuit and also precisely calculate the leakage current $I_0r$ even when a leakage current $I0c$ flowing caused by a ground capacitor in a facility of an electric circuit installed in a large size factory is high.

Technical Solution

According to an aspect of the present invention, a leakage current calculation device which extracts and measures a component caused by a ground insulation resistance value in an electric circuit from a leakage current flowing through the electric circuit having a predetermined protective conductor, includes: a current measurement means which measures the leakage current flowing through the electric circuit; a voltage measurement means which measures respective phase-to-E phase voltages which are voltages between respective phases of a power supply unit of the electric circuit and an E phase when the protective conductor is the E phase; a voltage value calculation means which calculates a predetermined voltage value obtained by extracting a voltage component applied to the ground insulation resistor excluding a potential difference caused by a grounding resistor of the protective conductor, based on the respective phase-to-E phase voltages; and a current value calculation means which extracts a component caused by the ground insulation resistance value excluding a ground capacitance component, from the leakage current, based on the predetermined voltage value.

Further, according to another aspect of the present invention, a leakage current calculation method which extracts and measures a component caused by a ground insulation resistance value in an electric circuit, from a leakage current flowing through the electric circuit having a predetermined protective conductor, includes: a current measuring step of measuring the leakage current flowing through the electric circuit; a voltage measuring step of measuring respective phase-to-E phase voltages which are voltages between respective phases of a power supply unit of the electric circuit and an E phase when the protective conductor is the E phase; a voltage value calculating step of calculating a predetermined voltage value obtained by extracting a voltage component applied to the ground insulation resistor excluding a potential difference caused by a grounding resistor of the protective conductor, based on the respective phase-to-E phase voltages; and a current value calculating step of extracting a component caused by the ground insulation resistance value excluding a ground capacitance component, from the leakage current, based on the predetermined voltage value.

Advantageous Effects

According to the leakage current calculation device and the leakage current calculation method of the present invention, a predetermined voltage value obtained by extracting a voltage component applied to a ground insulation resistor is calculated, excluding a potential difference caused by the grounding resistor of the protective conductor, based on a phase-to-E phase voltage and the leakage current $I_0r$ which is a component caused by the ground insulation resistance value excluding a ground capacitance component $I_0c$ from the leakage current $I_0$ is extracted and calculated based on the predetermined voltage, so that the leakage current $I_0r$ may be precisely calculated.

Further, even though the leakage current $I_0c$ flowing caused by the ground capacitor in the electric circuit installed in a large size factory is high, the leakage current $I_0r$ may be precisely calculated.

DESCRIPTION OF DRAWINGS

FIG. 1 is a circuit diagram illustrating a configuration of a leakage current calculation device and an electric circuit according to a first exemplary embodiment of the present invention.

FIG. 2 is a circuit diagram illustrating an example of a configuration of a voltage signal processing unit and a voltage value calculation unit provided in a leakage current calculation device.

FIG. 3 is a view illustrating each vector of respective phase-to-E phase voltages $V_{ER}$, $V_{ES}$, and $V_{ET}$.

FIG. 4 is a view illustrating a vector of a voltage $V_{ERT}$ obtained by combining an R phase-to-E phase voltage $V_{ER}$ and a T phase-to-E phase voltage $V_{ET}$.

FIG. 5 is a view illustrating a vector of a voltage $V_{ERST}$ obtained by combining respective phase-to-E phase voltages $V_{ER}$, $V_{ES}$, and $V_{ET}$.

FIG. 6 is a view illustrating a vector of a combined voltage $V_{ERST}$, a direction of a leakage current $I_0r$ flowing caused by a ground insulation resistor, and a direction of a leakage current $I_0c$ flowing caused by a ground capacitor.

FIG. 7 is a circuit diagram illustrating a configuration of a leakage current calculation device which measures each phase of ground voltages $V_{RG}$, $V_{SG}$, and $V_{TG}$ of a secondary side of a three phase transformer and an electric circuit.

FIG. 8 is an equivalent circuit illustrating a ground insulation resistance component of a load device, a ground capacitance component, a grounding resistor of a D class grounding, and a grounding resistor of a B class grounding in an electric circuit as an equivalent circuit of a path through which the leakage current $I_0$ flows, in the electric circuit illustrated in FIG. 7.

FIG. 9 is a view illustrating a path through which the leakage current $I_0$ flows, in the electric circuit illustrated in FIG. 7.

FIG. 10 is a flowchart illustrating each process of a leakage current calculation method according to a first exemplary embodiment of the present invention.

FIG. 11 is a view illustrating a configuration of an electric circuit which does not include an inverter and a leakage current calculation device connected to the electric circuit.

EXPLANATION OF REFERENCE NUMERALS AND SYMBOLS

10: Leakage current calculation device
11: Zero phase current transformer (ZCT, Current measurement means)
12: Voltage measurement means
121: Voltage acquisition unit
122: Voltage signal processing unit
13: Signal processing unit
131: Voltage value calculation unit (Voltage value calculation means)
132: Current signal processing unit (Current measurement means)
14: Calculation unit
141: Current value calculation unit (Current value calculation means)
142: Resistance value calculation unit
15: Display unit
A: Electric current
1: Three phase transformer
2: Inverter
3: Load device
3*a*: Motor
4: Distribution line
5: Panel

BEST MODE

Hereinafter, exemplary embodiments of a leakage current calculation device and a leakage current calculation method according to the present invention will be described with reference to FIGS. 1 to 9.

Here, a configuration of an electric circuit which supplies an AC power supply voltage to a predetermined load device will be described first, and then a configuration of a leakage current calculation device which measures a leakage current for the electric circuit will be described later.

[Electric Circuit]

As illustrated in FIG. 1, a power distribution system of an electric circuit A is a three phase three line system.

The electric circuit A includes a three-phase transformer 1, an inverter 2, a load device 3, and a distribution line 4.

The three phase transformer 1 is a power supply unit which converts an AC voltage on a primary side into an AC voltage on a secondary side and a connection system of the secondary side winding is delta connection.

A B class grounding is performed on one (S phase in FIG. 1) of an R phase, an S phase, and a T phase which are phases of the secondary side of the three phase transformer 1.

The B class grounding is a grounding connected to the ground such that a ground resistance value thereof is equal to or lower than a grounding resistance value of the B class grounding construction which is defined in an analysis of a technical standard of electric equipment.

The grounding resistance value of the B class grounding is considered as $R_B$. Further, among the R phase, the S phase, and the T phase which are phases of the secondary side of the three phase transformer 1, a phase (S phase in FIG. 1) on which a B class grounding is performed is considered as a grounding phase. Further, an electrode which is laid under the ground to perform the B class grounding is considered as a grounding electrode gpb.

Further, a line which connects the grounding electrode gpb and the grounding phase (S phase) is considered as a grounding line gcb.

The inverter 2 inputs an AC voltage output from the secondary side of the three phase transformer 1 and outputs a voltage (for example, an AC voltage obtained by converting a frequency of the input AC voltage) and sends the voltage to the load device 3.

Further, the R phase, the S phase, and the T phase of the three phase transformer 1 are connected to an input side of the inverter 2. Further, power input terminals U, V, and W of the motor 3a are connected to an output side of the inverter 2.

The load device 3 is a device which inputs a voltage output from the inverter 2 to perform a predetermined operation. In the exemplary embodiment, the motor 3a is an example of the load device 3.

The motor 3a inputs the AC voltage output from the inverter 2 as a source voltage and flows the AC current to each winding to rotate a rotation axis.

The D class grounding is performed on a housing of the motor 3a to prevent electric shock.

The D class grounding is a grounding connected to the ground such that a grounding resistance value is equal to or lower than a grounding resistance value of the D class grounding construction which is defined in an analysis of a technical standard of electric equipment.

A grounding resistance value of the D class grounding is considered as $R_D$. Further, a grounding terminal gt which performs the D class grounding is provided in the housing of the motor 3a. Furthermore, an electrode which is laid under the ground to perform the D class grounding is a grounding electrode gpd. A line which connects the grounding terminal gt of the motor 3a and the grounding electrode gpd is a grounding line gcd. As described above, the grounding terminal gt of the motor 3a and the grounding electrode gpd laid under the ground are connected by the grounding line gcd to perform the D class grounding on the housing of the motor 3a.

Further, in the exemplary embodiment, the motor 3a is an example of the load device 3 but the load device 3 is not limited to the motor 3a. When a device inputs a three phase AC voltage to perform a predetermined operation, the device may be used as the load device 3.

The distribution line 4 is a power line to supply the source voltage to the load device 3. The distribution line 4 includes a distribution line which connects the secondary side of the three phase transformer 1 and the inverter 2 and a distribution line which connects the inverter 2 and the load device 3.

Further, the electric circuit A has a predetermined protective conductor.

The protective conductor refers to a conductor which is used for various types of grounding as a conductor which is provided for protection, for example, electric shock.

For example, the protective conductor includes a conductor (the grounding line gcb, the grounding line gcd, the grounding electrode gpb, and the grounding electrode gpd) used for the B class grounding or the D class grounding, a conductor used for IT, TT, and TN grounding system, a conductor used for non-grounding (an impedance grounding such as a medical protection grounding or a server center), a grounding terminal gt provided in the load device 3, and a power line which is a distribution line 4.

These protective conductor is an E phase.

Specifically, in the electric circuit A illustrated in FIG. 1, the grounding line gcd which connects the grounding terminal gt of the motor 3a and the grounding electrode gpd is an example of the E phase.

[Leakage Current Calculation Device]

The leakage current calculation device 10 according to the exemplary embodiment is a device which extracts and measures a component caused by a ground insulating resistance value in the electric circuit A, from the leakage current flowing through the electric circuit A.

As illustrated in FIG. 1, the leakage current calculation device 10 includes a zero phase current transformer (ZCT) 11, a voltage measurement means 12, a signal processing unit 13, a calculation unit 14, and a display unit 15.

The zero phase current transformer (ZCT) 11 operates as a current measurement means and measures a leakage current flowing through the electric circuit A as a zero phase current $I_0$.

The zero current $I_0$ is obtained by combining a leakage current $I_0r$ which is a component caused by resistance values of ground insulation resistors Ru, Rv, and Rw of respective phases in the load device 3 and a leakage current $I_0c$ which is a component caused by ground capacitors Cu, Cv, and Cw of each phase.

Further, in FIG. 1, the zero phase current transformer 11 is illustrated in a one-dot chain line indicating a panel 5 such as a control panel. It is assumed that the distribution line 4 disposed in the panel 5 is sandwiched by a clamp unit of the zero phase current transformer 11 to measure a zero phase current $I_0$ flowing through the distribution line 4. However, when the zero phase current $I_0$ can be measured from the outside of the panel 5, for example, when the zero phase current $I_0$ is measured by sandwiching the clamp unit of the zero phase transformer 11 with respect to the distribution line 4 connected to the secondary side of the three phase transformer 1, the distribution line 4 connected to the power terminal of the motor 3a, or the grounding line gcb which connects the S phase of the secondary side of the three phase transformer 1 and the grounding electrode gpb of the B class grounding, the above-described method may be used.

The voltage measurement means 12 measures respective phase-to-E phase voltages which are voltages between respective phase (the R phase, the S phase, and the T phase) of three phases of the secondary side (output side) of the three phase transformer 1 and the E phase.

The voltage measurement means 12 includes a voltage acquisition unit 121 and a voltage signal processing unit 122.

The voltage acquisition unit 121 is a part which is electrically connected to each of the R phase, the S phase, the T phase, and the E phase to acquire respective phase-to-E phase voltages.

Four voltage acquisition units 121 are connected in the leakage current calculation device 10. When four voltage acquisition units 121 are voltage acquisition units 121a, 121b, 121c, and 121d, one voltage acquisition unit 121a of four voltage acquisition units is connected to the R phase, another voltage acquisition unit 121b is connected to the S phase, still another voltage acquisition unit 121c is connected to the T phase, and the remaining voltage acquisition unit 121d is connected to the E phase.

Further, in FIG. 1, in the one-dot chain line indicating the panel 5, a connection portion of three voltage acquisition units 121a to 121c and the distribution line 4 is illustrated. However, when it is possible to connect three voltage acquisition units 121a to 121c and the distribution line 4 to each other in the outside of the panel 5, the connection may be performed by the above-described method.

Further, in FIG. 1, in the one-dot chain line indicating the panel 5, a connection portion of the voltage acquisition unit 121*d* and the grounding line gcd is illustrated. However, when it is possible to connect the voltage acquisition unit 121*d* and the grounding line gcd to each other in the outside of the panel 5, the connection may be performed by the above-described method.

The voltage signal processing unit 122 inputs each phase of voltage through four voltage acquisition units 121*a* to 121*d* which are connected to the R phase, the S phase, the T phase, and the E phase, respectively and measures the respective phase-to-E phase voltages based on each phase of voltage.

Each phase voltage includes an R phase voltage $V_R$, an S phase voltage $V_S$, a T phase voltage $V_T$, and an E phase voltage $V_E$.

Further, respective phase-to-E phase voltages include a R phase-to-E phase voltage $V_{ER}$ which is a voltage between the R phase and the E phase, an S phase-to-E phase voltage $V_{ES}$ which is a voltage between the S phase and the E phase, and a T phase-to-E phase voltage $V_{ET}$ which is a voltage between the T phase and the E phase.

A voltage capturing device which measures respective phase-to-E phase voltages based on each phase voltage may be used for the voltage signal processing unit 122.

The voltage capturing device inputs the R phase voltage $V_R$ and the E phase voltage $V_E$ and outputs a difference between the voltage $V_R$ and the voltage $V_E$ as the R phase-to-E phase voltage $V_{ER}$. Further, the voltage capturing device inputs the S phase voltage $V_S$ and the E phase voltage $V_E$ and outputs a difference between the voltage $V_S$ and the voltage $V_E$ as the S phase-to-E phase voltage $V_{ES}$. Further, the voltage capturing device inputs the T phase voltage $V_T$ and the E phase voltage $V_E$ and outputs a difference between the voltage $V_T$ and the voltage $V_E$ as the T phase-to-E phase voltage $V_{ET}$.

Further, the voltage signal processing unit 122 may include a function of removing a noise (a harmonic component) from the voltage input through the voltage acquisition units 121*a* to 121*d*.

Further, the voltage capturing device which serves as the voltage signal processing unit 122 may be configured by a circuit configuration using analog amplifiers AM1 to AM3, for example, as illustrated in FIG. 2.

That is, the circuit configuration of the analog amplifiers AM1 to AM3 illustrated in FIG. 2 is an example of a circuit configuration of the voltage signal processing unit 122. When as a circuit which uses an element other than the analog amplifier, the circuit is capable of acquiring respective phase-to-E phase voltages, the circuit may be used as the voltage signal processing unit 122.

The signal processing unit 13 includes the voltage signal processing unit 122 (described above), a voltage value calculation unit 131, and a current signal processing unit 132.

The voltage value calculation unit 131 operates as the voltage value calculation means and combines respective phase-to-E phase voltages when respective phase-to-E phase voltages are received from the voltage signal processing unit 122.

An addition device which combines respective phase-to-E phase voltages may be used for the voltage value calculation unit 131.

The addition device inputs and combines the R phase-to-E phase voltage $V_{ER}$, the S phase-to-E phase voltage $V_{ES}$, and the T phase-to-E phase voltage $V_{ET}$ which are respective phase-to-E phase voltages and outputs a combined voltage $V_{ERST}$.

An operation of the addition device will be described using a vector.

The R phase-to-E phase voltage $V_{ER}$, the S phase-to-E phase voltage $V_{ES}$, and the T phase-to-E phase voltage $V_{ET}$ which are respective phase-to-E phase voltages are represented by vectors as illustrated in FIG. 3.

Further, when an interline voltage $V_{TR}$ of the T phase and the R phase, an interline voltage $V_{RS}$ of the R phase and the S phase, and an interline voltage $V_{ST}$ of the S phase and the T phase are measured, a dotted line illustrated in FIG. 3 represents a position of vectors of interline voltages $V_{TR}$, $V_{RS}$, and $V_{ST}$ on the same electric circuit A.

First, the T phase-to-E phase voltage $V_{ET}$ and the R phase-to-E phase voltage $V_{ER}$ are combined. The combined voltage is $V_{ERT}$ and illustrated in FIG. 4.

Next, the combined voltage $V_{ERT}$ and the S phase-to-E phase voltage $V_{ES}$ are combined. The combined voltage is $V_{ERST}$ and illustrated in FIG. 5.

The combined voltage $V_{ERST}$ is formed by the combined voltage of respective phase-to-E phase voltages, that is, the R phase-to-E phase voltage $V_{ER}$, the S phase-to-E phase voltage $V_{ES}$ and the T phase-to-E phase voltage $V_{ET}$.

The voltage value calculation unit 131 sends the combined voltage $V_{ERST}$ to a current value calculation unit 141 of the calculation unit 14.

Further, even though a sequence of calculating the combined voltage $V_{ERST}$ by combining the combined voltage $V_{RT}$ and the S phase-to-E phase voltage $V_{ES}$ after combining the T phase-to-E phase voltage $V_{ET}$ and the R phase-to-E phase voltage $V_{ER}$ has been descried here for the convenience of description, the sequence of calculating the combined voltage $V_{ERST}$ is not limited to the above-described sequence.

Further, the addition device which serves as the voltage value calculation unit 131 may be configured by a circuit configuration using an analog amplifier AM4, for example, as illustrated in FIG. 2.

However, the circuit configuration of the analog amplifier AM4 illustrated in FIG. 2 is an example of a circuit configuration of the voltage value calculation unit 131. When as a circuit which uses an element other than the analog amplifier, the circuit is capable of combining respective phase-to-E phase voltages or a device is capable of combining respective phase-to-E phase voltages, the circuit or the device may be used as the voltage value calculation unit 131.

Further, a direction of the vector of the combined voltage $V_{ERST}$ may be the same as a phase of the leakage current $I_0r$ which is a component caused by a ground insulation resistance value of the load device 3, in the leakage current $I_0$ flowing through the electric circuit A (see FIG. 6).

This is because the combined voltage $V_{ERST}$ is a voltage obtained by combining respective phase-to-E phase voltages $V_{ER}$, $V_{ES}$, and $V_{ET}$ and respective phase-to-E phase voltages $V_{ER}$, $V_{ES}$, and $V_{ET}$ are voltages which are generated in the ground insulating resistors Ru, Rv, and Rw of the load device 3, excluding a potential difference caused by the grounding resistors of the D class grounding and the B class grounding.

Further, a direction which is shifted by 90 degrees from a direction of the vector of the combined voltage $V_{ERST}$ may be the same as a phase of the leakage current $I_0c$ which is a component caused by a ground capacitor of the load device 3, in the leakage current $I_0$ flowing through the electric circuit A (see FIG. 6).

The current signal processing unit 132 operates as a current measurement means and inputs a current output from the zero phase current transformer 11 as a zero phase current $I_0$ and sends the current to the current value calculation unit 141 of the calculation unit 14.

Further, the current signal processing unit 132 includes a function of amplifying the zero phase current $I_0$ input from the zero phase current transformer 11 or removing a noise (a harmonic component) from the zero phase current.

The calculation unit 14, for example, is configured by a computer including interfaces such as a central processing unit (CPU), a ROM, a RAM, and an I/O and includes the current value calculation unit 141 and a resistance value calculation unit 142.

The current value calculation unit 141 operates as the current value calculation means and simultaneously inputs the combined voltage $V_{ERST}$ sent from the voltage value calculation unit 131 and inputs the zero phase current $I_0$ sent from the current signal processing unit 132 and extracts and calculates the leakage current $I_0 r$ flowing caused by the ground insulation resistors Ru, Rv, and Rw based on the combined voltage $V_{ERST}$ and the zero phase current $I_0$.

The leakage current $I_0 r$ may be calculated using the following Equation 1.

$$I_0 r = I_0 \cdot \cos \theta \quad \text{Equation 1}$$

In Equation 1, $I_0$ is an effective value of the zero phase current $I_0$ input from the current signal processing unit 132. Further, $\theta$ is a phase difference of the combined voltage $V_{ERST}$ and the zero phase current $I_0$.

The reason why the leakage current $I_0 r$ is calculated using Equation 1 is as follows.

When respective phase-to-E phase voltages $V_{ER}$, $V_{ES}$, and $V_{ET}$ are measured, the leakage current calculation device 10 according to the exemplary embodiment calculates the combined voltage $V_{ERST}$ obtained by combining respective phase-to-E phase voltages $V_{ER}$, $V_{ES}$, and $V_{ET}$. The combined voltage $V_{ERST}$ is represented by vectors, as illustrated in FIG. 6.

As illustrated in FIG. 6, the combined voltage $V_{ERST}$ has the same phase as the leakage current $I_0 r$. Further, the phase difference of the combined voltage $V_{ERST}$ and the zero phase current $I_0$ is represented by $\theta$ of Equation 1.

Therefore, the leakage current $I_0 r$ may be calculated using Equation 1.

Further, in Equation 1, $\theta$ is a phase difference of the combined voltage $V_{ERST}$ and the zero phase current $I_0$ and the combined voltage $V_{ERST}$ is a combined voltage of the respective phase-to-E phase voltages. The respective phase-to-E phase voltages $V_{ER}$, $V_{ES}$, and $V_{ET}$ do not include a potential difference caused by the grounding resistor of the protective conductor, but are measured as voltages caused by ground insulation resistors Ru, Rv, and Rw. Therefore, the leakage current calculation device 10 according to the exemplary embodiment may precisely calculate $\theta$ and precisely calculate the leakage current $I_0 r$.

As described above, the current value calculation unit 141 extracts and calculates the leakage current $I_0 r$ which is a component caused by the ground insulation resistance value, excluding the ground capacitance component $I_0 c$ from the leakage current $I_0$, based on the combined voltage $V_{ERST}$.

Further, the leakage current $I_0 r$ calculated herein is obtained by combining a leakage current flowing caused by the ground insulation resistor Ru, a leakage current flowing caused by the ground insulation resistor Rv, and a leakage current flowing caused by the ground insulation resistor Rw.

The current value calculation unit 141 stores various data (for example, the zero phase current $I_0$, the combined voltage $V_{ERST}$, and the leakage current $I_0 r$) in the storage unit (not illustrated) such as a RAM. Further, the current value calculation unit 141 sends the data to the resistance value calculation unit 142. Further, the current value calculation unit 141 may send the data to the display unit 15.

The resistance value calculation unit 142 calculates a combined resistance value R0 of the ground insulation resistors Ru, Rv, and Rw in the load device 3 using the combined voltage $V_{ERST}$ and the leakage current $I_0 r$.

The combined resistance value R0 may be calculated using the following Equation 2.

$$\text{Combined resistance value } R0 = \text{Combined voltage } V_{ERST} \div \text{Leakage current } I_0 r \quad \text{Equation 2}$$

The resistance value calculation unit 142 stores various data (for example, the calculated combined resistance value R0 of the ground insulation resistors) in the storage unit (not illustrated). Further, the current value calculation unit 142 sends the data to the display unit 15.

The display unit 15 inputs various data sent from the calculation unit 14 and displays predetermined data on a screen. Further, the display unit 15 displays designated data on the screen by manipulating an input manipulation unit (not illustrated) configured by a physical key or a software key by a user. The various data displayed on the display unit 15 includes data sent from the resistance value calculation unit 142 or the current value calculation unit 141 or data withdrawn from the storage unit. For example, a liquid crystal display may be used for the display unit 15.

[Reason why Respective Phase-to-E Phase Voltages are Measured]

Next, a reason why respective phase-to-E phase voltages are measured will be described.

For comparison, the following measuring methods will be sequentially described here.

[1] Case when R phase, S phase, and T phase ground voltages are measured

[2] Case when R phase, S phase, and T phase interline voltages are measured

[3] Case when respective phase-to-E phase voltages are measured

Further, [1] to [3] will be described with reference to FIGS. 7 to 9. FIG. 7 is a circuit diagram illustrating a configuration of a leakage current calculation device 100 which measures R phase, S phase, and T phase ground voltages and an electric circuit A. FIG. 8 is an equivalent circuit diagram of a path through which the leakage current $I_0$ flows, in the electric circuit A illustrated in FIG. 7. FIG. 9 is a view illustrating a path through which the leakage current $I_0$ flows, in the electric circuit A illustrated in FIG. 7 and illustrates that respective phase-to-E phase voltages are applied to both terminals of a parallel circuit of a ground insulation resistor Ru and a ground capacitor Cu, a parallel circuit of a ground insulation resistor Rv and a ground capacitor Cv, and a parallel circuit of a ground insulation resistor Rw and a ground capacitor Cw of the load device 3. FIGS. 7 to 9 illustrate a configuration of the electric circuit A which is not connected to the inverter 2 or an equivalent circuit of the corresponding electric circuit A, for simple description and easy understanding of [1] to [3]. A case when the ground voltage, the interline voltage, and respective phase-to-E phase voltages are measured for the electric circuit A illustrated in FIGS. 7 to 9 will be described by the following [1] to [3].

[1] Case when R Phase, S Phase, and T Phase Ground Voltages are Measured

In this case, the voltages to be measured are an R phase voltage $V_{RG}$ for the ground G, an S phase voltage $V_{SG}$ for the ground G, and a T phase voltage $V_{TG}$ for the ground G, as illustrated in FIG. 7.

As illustrated in FIG. 8, the equivalent circuit may be represented by a circuit in which a parallel circuit (hereinafter, referred to as a "ground component circuit 3b of the load device 3") of the ground insulation resistors Ru, Rv, and Rw and the ground capacitors Cu, Cv, and Cw of the load device 3 and a serial circuit of a grounding resistor $R_D$ of the D class grounding and a grounding resistor $R_B$ of the B class grounding are connected in series.

Further, in the equivalent circuit illustrated in FIG. 8, it is assumed that a point x is between a secondary side of the three phase transformer 1 and a ground component circuit 3b of the load device 3, a point y is between the ground component circuit 3b of the load device and a grounding resistor $R_D$ of the D class grounding, and a point z is between the grounding resistor of the D class grounding and a grounding resistor of the B class grounding.

In this equivalent circuit, R phase, S phase, and T phase ground voltages $V_{RG}$, $V_{SG}$, and $V_{TG}$ are voltages between the point x and the point z.

However, since the ground voltages $V_{RG}$, $V_{SG}$, and $V_{TG}$ are voltages between the point x and the point z, the ground voltages also include a potential difference VeD generated in the grounding resistor $R_D$. That is, the ground voltages $V_{RG}$, $V_{SG}$, and $V_{TG}$ are higher than a voltage (a voltage between the point x and the point y) which is applied to both terminals of the ground insulation resistors Ru, Rv, and Rw by a potential difference VeD generated in the grounding resistor $R_D$.

Further, not only the leakage current $I_0r$, but also the leakage current $I_0c$ flows through the grounding resistor $R_D$.

Therefore, even when the ground voltages $V_{RG}$, $V_{SG}$, and $V_{TG}$ are used, the leakage current $I_0r$ flowing caused by the ground insulation resistance value may not be precisely calculated.

[2] Case when R Phase, S Phase, and T Phase Interline Voltages are Measured

The interline voltages are the R phase to T phase voltage $V_{RT}$, the T phase to S phase voltage $V_{TS}$, and the S phase to R phase voltage $V_{SR}$ on the secondary side of the three phase transformer 1.

The interline voltages are voltages which are applied not only to the ground component circuit 3b but also to the grounding resistor $R_D$ or the grounding resistor $R_B$ in the equivalent circuit illustrated in FIG. 8 (the interline voltages are not illustrated in FIG. 8).

Further, the leakage current $I_0r$ is a leakage current flowing caused by the ground insulation resistors Ru, Rv, and Rw. Further, not only the leakage current $I_0r$ flows through the grounding resistor $R_D$ or the grounding resistor $R_B$, but also the leakage current $I_0c$ flows through the grounding resistor $R_D$ or the grounding resistor $R_B$.

Further, when only the interline voltages $V_{RT}$, $V_{TS}$, and $V_{SR}$ are measured, the leakage current $I_0r$ may not be precisely calculated.

[3] Case when Respective Phase-to-E Phase Voltages are Measured

As illustrated in FIG. 8, respective phase-to-E phase voltages $V_{ER}$, $V_{ES}$, and $V_{ET}$ are voltages (voltages between the point x and the point y) which are applied to both terminals of the ground component circuit 3b. That is, as illustrated in FIG. 9, respective phase-to-E phase voltages $V_{ER}$, $V_{ES}$, and $V_{ET}$ are voltages which are applied to both terminals of a parallel circuit of the ground insulation resistors Ru, Rv, and Rw and the ground capacitors Cu, Cv, and Cw in the R, S, and T phases.

Further, the voltage $V_{ERST}$ obtained by combining respective phase-to-E phase voltages $V_{ER}$, $V_{ES}$, and $V_{ET}$ has the same phase as the leakage current $I_0r$ obtained by combining leakage currents flowing through the ground insulation resistors Ru, Rv, and Rw of the load device 3. Further, a current whose phase proceeds 90 degrees from the combined voltage $V_{ERST}$ is in phase with the leakage currents $I_0C$ obtained by combining the leakage currents flowing through the ground capacitors Cu, Cv, and Cw (see FIG. 6).

That is, the combined voltage $V_{ERST}$ has a predetermined voltage value obtained by extracting a voltage component applied to the ground insulation resistors Ru, Rv, and Rw of the load device 3, excluding a potential difference generated by the grounding resistors of the D class grounding and the B class grounding.

Accordingly, the leakage current $I_0r$ may be precisely calculated using the voltage $V_{ERST}$ obtained by combining the respective phase-to-E phase voltages $V_{ER}$, $V_{ES}$, and $V_{ET}$.

Further, even though the respective phase-to-E phase voltages are measured in the related art which calculates the leakage current $I_0r$, according to the related art, it is assumed that the measurement value is a ground voltage or an interline voltage and the leakage current $I_0r$ is calculated. Therefore, according to the related art, the leakage current $I_0r$ may not be precisely calculated.

Here, the case when the ground voltage, the interline voltage, and respective phase-to-E phase voltages are measured for the electric circuit A to which the inverter 2 is not connected has been described by [1] to [3]. Further, also when respective phase-to-E phase voltages are measured for the electric circuit A to which the inverter 2 is connected, it is similar to the description of [3]. That is, when the leakage current calculation device 10 according to the present invention is used and respective phase-to-E phase voltages $V_{ER}$, $V_{ES}$, and $V_{ET}$ are measured for the electric circuit A to which the inverter 2 is connected, the voltage $V_{ERST}$ obtained by combining the respective phase-to-E phase voltages $V_{ER}$, $V_{ES}$, and $V_{ET}$ has a predetermined voltage value obtained by extracting a voltage component which is applied to the ground insulation resistors Ru, Rv, and Rw of the load device 3, excluding a potential difference generated by the grounding resistors of the D class grounding and B class grounding. Therefore, the combined voltage $V_{ERST}$ is used to precisely calculate the leakage current $I_0r$.

[Leakage Current Calculation Method]

Next, a leakage current calculation method according to an exemplary embodiment will be described with reference to FIGS. 1 and 10.

FIG. 10 is a flowchart illustrating processes of a leakage current calculation method performed by the leakage current calculation device 10.

As a preparation step, a distribution line 4 or a grounding line gcb is sandwiched by a clamp unit of a zero phase current transformer 11.

Further, the voltage acquisition unit 121 of the voltage measurement means 12 is electrically connected to the distribution lines 4 (R phase, S phase, and T phase) of the electric circuit A and the grounding line gcd (E phase). Specifically, the voltage acquisition unit 121a is connected to the R phase, the voltage acquisition unit 121b is connected to the S phase, the voltage acquisition unit 121c is connected to the T phase, and the voltage acquisition unit 121d is connected to the E phase.

The zero phase current transformer 11 sends an induced current generated in a magnetic core in the clamp to the current signal processing unit 132 by a magnetic field generated around the distribution lines 4 or the grounding line gcb based on the zero phase current $I_0$ flowing through the electric circuit A (the distribution line 4 or the grounding line gcb).

The current signal processing unit 132 sends an induced current flowing from the zero phase current transformer 11 to the current value calculation unit 141 of the calculation unit 14 as a zero phase current $I_0$ (a current measuring step S10).

The voltage signal processing unit 122 of the voltage measurement means 12 inputs R phase, S phase, T phase, and E phase voltages $V_R$, $V_S$, $V_T$, and $V_E$ through the voltage acquisition unit 121 and measures the R phase-to-E phase voltage $V_{ER}$ which is a voltage between the R phase and the E phase, the S phase-to-E phase voltage $V_{ES}$ which is a voltage between the S phase and the E phase, and a T phase-to-E phase voltage $V_{ET}$ which is a voltage between the T phase and the E phase as respective phase-to-E phase voltages, respectively, based on the input respective phase voltages $V_R$, $V_S$, $V_T$, and $V_E$ (a voltage measuring step S11).

The voltage value calculation unit 131 combines the respective phase-to-E phase voltages (a voltage value calculating step S12). The voltage value calculation unit 131 sends the combined voltage $V_{ERST}$ to a current value calculation unit 141.

The current value calculation unit 141 calculates a leakage current $I_0r$ flowing caused by a ground insulation resistance value, based on the zero phase current $I_0$ sent from the current signal processing unit 132 and the combined voltage $V_{ERST}$ sent from the voltage value calculation unit 131 (a current value calculating step S13).

The resistance value calculation unit 142 calculates a resistance value R0 of the ground insulation resistor in the load device 3, based on the leakage current $I_0r$ and the combined voltage $V_{ERST}$ (S14).

The zero phase current $I_0$, the respective phase-to-E phase voltages, the combined voltage $V_{ERST}$, the leakage current $I_0r$, the resistance value R0 of the ground insulation resistor measured or calculated as described above are stored in the storage unit (not illustrated). Further, the zero phase current $I_0$ may be displayed on the display unit 15.

As described above, according to the leakage current calculation device and the leakage current calculation method of the exemplary embodiment, a predetermined voltage value obtained by extracting a voltage component applied to a ground insulation resistor excluding a potential difference caused by the grounding resistor of the protective conductor is calculated based on a phase-to-E phase voltage, and the leakage current $I_0r$ which is a component caused by the ground insulation resistance value, excluding a ground capacitance component $I_0c$ from the leakage current $I_0$, is extracted and calculated based on the predetermined voltage, so that the leakage current $I_0r$ may be precisely calculated.

Further, even though the leakage current $I_0c$ flowing caused by the ground capacitor in the electric circuit installed in a large size factory is high, the leakage current $I_0r$ may be precisely calculated.

Even though exemplary embodiments of the leakage current calculation device and the leakage current calculation method of the present invention have been described above, the leakage current calculation device and the leakage current calculation method of the present invention are not limited the above-described exemplary embodiments, and various modification may be allowed within the scope of the present invention.

For example, even though the power distribution system of the electric circuit A is a three phase three line system in FIG. 1, the power distribution system is not limited to the three phase three line system, but may be a three phase four line system, a single phase three line system, or a single phase two line system. Further, when the power distribution system of the electric circuit is the three phase four line system, respective phase-to-E phase voltages may be an R phase-to-E phase voltage, a T phase-to-E phase voltage, an S phase-to-E phase voltage, and an N phase-to-E phase voltage. Further, when the power distribution system of the electric circuit is the single phase three line system, respective phase-to-E phase voltages may be an L1 phase-to-E phase voltage, an L2 phase-to-E phase voltage, and an N phase-to-E phase voltage. Furthermore, when the power distribution system of the electric circuit is the single phase two line system, respective phase-to-E phase voltages may be an a phase-to-E phase voltage and a b phase-to-E phase voltage.

In FIG. 1, even though the connection system of the secondary side winding of the three phase transformer is delta connection, the connection system may be V connection or star connection.

Further, in FIG. 1, even though the connection system of the primary side of the three phase transformer is star connection, the connection system may be delta connection.

Further, the electric circuit includes a power cable connected to the load device in addition to the three phase transformer, the load device, and the distribution line.

Further, in the above-described exemplary embodiment, even though the electric circuit is configure to include the three phase transformer, the inverter, and the load device, the electric circuit is not limited to this configuration and may be configured so as not to include the inverter, as illustrated in FIG. 11. In this case, the load device inputs an AC voltage output from the secondary side of the three phase transformer as a power voltage to perform a predetermined operation.

Further, even though the electric circuit is configured as illustrated in FIG. 11, the leakage current calculation device of the present invention may calculate the combined voltage $V_{ERST}$, similarly to the above description of the exemplary embodiment.

However, the leakage current calculation device of the present invention may calculate the leakage current $I_0r$ as follows.

For example, as a known equation used to calculate the leakage current $I_0r$, there is a following Equation 3.

$$I_0r = I_0 \cdot \sin\theta / \cos 30° \qquad \text{Equation 3}$$

Equation 3 is a known equation used to calculate the leakage current $I_0r$ in an electric circuit (the electric circuit A as illustrated in FIG. 11) to which the inverter is not connected.

In Equation 3, $I_0$ is an effective value of the zero phase current $I_0$.

Further, Equation 3 is created with respect to the interline voltage $V_{TR}$ between the T phase and the R phase. Therefore, θ in Equation 3 is a phase difference of the combined voltage $V_{TR}$ and the zero phase current $I_0$.

In contrast, the leakage current calculation device of the present invention calculates the combined voltage $V_{ERST}$ obtained by combining respective phase-to-E phase voltages $V_{ER}$, $V_{ES}$, and $V_{ET}$. Further, the measurement method with respect to the combined voltage $V_{ERST}$ has a phase difference of 90 degrees as compared with the known measurement method with respect to the interline voltage $V_{TR}$.

The reason why the phase difference of 90 degrees is generated is as follows. For simple description and easy understanding, a condition that the grounding resistance is 0Ω and a potential difference between the E phase and the S phase is 0 V is considered. Further, it is considered that the resistance value of the R phase ground insulation resistor Ru is equal to the resistance value of the T phase ground insulation resistor Rw and an amplitude of the leakage current $I_0$r-R flowing through the ground insulation resistor Ru is equal to an amplitude of the leakage current $I_0$r-T flowing through the ground insulation resistor Rw. In this condition, a vector of the leakage current $I_0$r has a phase difference of 0 degree from the combined voltage $V_{ERST}$ with respect to the combined voltage $V_{ERST}$, but has a phase difference of 90 degrees from the interline voltage $V_{TR}$ with respect to the interline voltage $V_{TR}$. Therefore, the measurement method with respect to the combined voltage $V_{ERST}$ has a phase difference of 90 degree from the known measurement method with respect to the interline voltage $V_{TR}$.

Accordingly, the following Equation 4 obtained by adding the phase difference to θ of Equation 3 is used to calculate the leakage current $I_0$r with respect to the combined voltage $V_{ERST}$.

$$I_0r = I_0 \cdot \sin(\theta + 90°)/\cos 30° \quad \text{Equation 4}$$

In Equation 4, θ is a phase difference of the combined voltage $V_{ERST}$ and the zero phase current $I_0$. Further, the combined voltage $V_{ERST}$ is a combined voltage of the respective phase-to-E phase voltages. The respective phase-to-E phase voltages $V_{ER}$, $V_{ES}$, and $V_{ET}$ do not include a potential phase caused by the grounding resistance of the protective conductor and are measured as voltages caused by ground insulation resistors Ru, Rv, and Rw. Therefore, the leakage current calculation device of to the present invention may precisely calculate θ for the electric circuit to which the inverter is not connected, thereby precisely calculating the leakage current $I_0$r.

INDUSTRIAL APPLICABILITY

The present invention may be widely used for a device of measuring a leakage current of an electric circuit.

The invention claimed is:

1. A leakage current calculation device which extracts and measures and displays a component caused by a ground insulation resistance value in an electric current, from a leakage current flowing through the electric circuit having a D class grounding, the device comprising:
   a zero phase current transformer which measures the leakage current flowing through the electric circuit;
   a voltage acquisition unit which measures respective phase-to-E phase voltages which are voltages between respective phases of a power supply unit of the electric circuit and an E phase when the D class grounding is the E phase;
   a voltage value calculation means which calculates a predetermined voltage value obtained by extracting a voltage component applied to the ground insulation resistor excluding a potential difference caused by a grounding resistor of the D class grounding, based on the respective phase-to-E phase voltages;
   a current value calculation means which extracts a component caused by the ground insulation resistance value excluding a ground capacitance component, from the leakage current, based on the predetermined voltage value;
   a combined resistance value calculation means which divides the predetermined voltage value by a component caused by the ground insulation resistance value, excluding the ground capacitance component, from the leakage current, to calculate a combined resistance value obtained by combining the component and the around insulation resistance value in the electric circuit,
   wherein the voltage value calculation means calculates a combined voltage which is a voltage obtained by adding respective phase-to-E phase voltages as the predetermined voltage value,
   the current value calculation means extracts a component which has the same phase as a phase of the combined voltage in the leakage current, excluding a ground capacitance component from the leakage current, as a component caused by the ground insulation resistance value;
   a display that displays the component of the leakage current caused by the ground insulation resistance value after it has been calculated; and
   wherein the leakage current calculation device precisely calculates the leakage current component caused by the ground insulation resistance value of the electric circuit excluding the ground capacitance component from the leakage current.

2. The device of claim 1, wherein the respective phases of the power supply unit are a R phase, an S phase, and a T phase, the respective phase-to-E phase voltages are a R phase-to-E phase voltage which is a voltage between the R phase and the E phase, an S phase-to-E phase voltage which is a voltage between the S phase and the E phase, and a T phase-to-E phase voltage which is a voltage between the T phase and the E phase, and the voltage value calculation means calculates a voltage obtained by adding the R phase-to-E phase voltage, the S phase-to-E phase voltage, and the T phase-to-E phase voltage as the combined voltage.

3. The device of claim 2, wherein the electric circuit includes:
   an inverter which converts an AC voltage output from the power supply unit into a predetermined voltage and outputs the converted predetermined voltage; and
   a load device which inputs the predetermined voltage output from the inverter to be operated.

4. The device of claim 1, wherein the electric circuit includes:
   an inverter which converts an AC voltage output from the power supply unit into a predetermined voltage and outputs the converted predetermined voltage; and
   a load device which inputs the predetermined voltage output from the inverter to be operated.

5. A leakage current calculation method, performed by a leakage current calculation device, which extracts and measures and displays a component caused by a ground insulation resistance value in an electric circuit, from a leakage current flowing through the electric circuit having a D class grounding, the method comprising:
   a current measuring step, performed by a zero phase current transformer, of measuring the leakage current flowing through the electric circuit;
   a voltage measuring step, performed by a voltage acquisition unit, of measuring respective phase-to-E phase voltages which are voltages between respective phases of a power supply unit of the electric circuit and an E phase when the D class grounding is the E phase;

a voltage value calculating step, performed by a voltage value calculation unit, of calculating a predetermined voltage value obtained by extracting a voltage component applied to the ground insulation resistor excluding a potential difference caused by a ground resistor of the D class grounding, based on the respective phase-to-E phase voltages;

a current value calculating step, performed by a current value calculation unit, of extracting a component caused by the ground insulation resistance value excluding a ground capacitance component from the leakage current, based on the predetermined voltage value;

a combined resistance value calculating step of dividing the predetermined voltage value by the component caused by the ground insulation resistance value, excluding the ground capacitance component from the leakage current to calculate a combined resistance value obtained by combining the component and the ground insulation resistance value in the electric circuit;

wherein in the voltage value calculating step, a combined voltage which is a voltage obtained by adding respective phase-to-E phase voltages is calculated as the predetermined voltage value;

wherein in the current value calculating step, a component which has the same phase as a phase of the combined voltage in the leakage current is extracted as a component caused by the ground insulation resistance value, excluding a ground capacitance component from the leakage current;

displaying, on a display of the leakage current calculation device, the component of the leakage current caused by the ground insulation resistance value after it has been calculated; and wherein the leakage current calculation device precisely calculates the leakage current component caused by the ground insulation resistance value of the electric circuit excluding the ground capacitance component from the leakage current.

* * * * *

UNITED STATES PATENT AND TRADEMARK OFFICE
CERTIFICATE OF CORRECTION

PATENT NO. : 10,145,886 B2
APPLICATION NO. : 15/514499
DATED : December 4, 2018
INVENTOR(S) : Kenya Matsushita and Masakatsu Sawada Page 1 of 1

It is certified that error appears in the above-identified patent and that said Letters Patent is hereby corrected as shown below:

In the Claims

In Column 16, Line 12, Claim 1 delete "around" and insert --ground--.

Signed and Sealed this
Twenty-second Day of January, 2019

Andrei Iancu
*Director of the United States Patent and Trademark Office*